(12) United States Patent
Bellmann et al.

(10) Patent No.: US 7,892,382 B2
(45) Date of Patent: Feb. 22, 2011

(54) ELECTROLUMINESCENT DEVICES AND METHODS OF MAKING ELECTROLUMINESCENT DEVICES INCLUDING A COLOR CONVERSION ELEMENT

(75) Inventors: Erika Bellmann, St. Paul, MN (US);
Vadim Savvateev, St. Paul, MN (US);
Martin B. Wolk, Woodbury, MN (US);
Yong Hsu, Woodbury, MN (US); Fred B. McCormick, Maplewood, MN (US);
John S. Staral, Woodbury, MN (US);
Khanh T. Huynh, Eagan, MN (US)

(73) Assignee: Samsung Mobile Display Co., Ltd., Yongin (KR)

( * ) Notice: Subject to any disclaimer, the term of this patent is extended or adjusted under 35 U.S.C. 154(b) by 1102 days.

(21) Appl. No.: 10/989,524

(22) Filed: Nov. 16, 2004

(65) Prior Publication Data

US 2005/0116621 A1 Jun. 2, 2005

Related U.S. Application Data

(60) Provisional application No. 60/520,997, filed on Nov. 18, 2003.

(51) Int. Cl.
*B32B 15/00* (2006.01)
(52) U.S. Cl. ............... 156/230; 156/235; 430/200; 430/321
(58) Field of Classification Search ............... None
See application file for complete search history.

(56) References Cited

U.S. PATENT DOCUMENTS

| | | | |
|---|---|---|---|
| 4,252,671 A | 2/1981 | Smith | |
| 4,897,319 A | 1/1990 | Sun | |
| 5,166,024 A | 11/1992 | Bugner et al. | |
| 5,171,650 A | 12/1992 | Ellis et al. | |
| 5,256,506 A | 10/1993 | Ellis et al. | |
| 5,278,023 A | 1/1994 | Bills et al. | |

(Continued)

FOREIGN PATENT DOCUMENTS

DE 19623881 11/1997

(Continued)

OTHER PUBLICATIONS

"Vertical-Cavity Organic Light-Emitting Diode Display", IBM Technical Disclosure Bulletin, vol. 40, No. 9, Sep. 1997.

(Continued)

*Primary Examiner*—Philip C Tucker
*Assistant Examiner*—Kimberly K McClelland
(74) *Attorney, Agent, or Firm*—Christie, Parker & Hale, LLP

(57) ABSTRACT

An electroluminescent device, and a method of making an electroluminescent device that includes one or more color conversion elements is disclosed. In one embodiment, the method includes forming an electroluminescent element on a substrate, where the electroluminescent element is capable of emitting light in a narrow band. The method further includes selectively thermally transferring a plurality of color conversion elements to the electroluminescent element. In another embodiment, the method includes forming an electroluminescent element on a substrate, where the electroluminescent element is capable of emitting UV light. The method further includes selectively thermally transferring a plurality of color conversion elements to the electroluminescent element.

33 Claims, 2 Drawing Sheets

U.S. PATENT DOCUMENTS

| | | | |
|---|---|---|---|
| 5,308,737 A | 5/1994 | Bills et al. | |
| 5,351,617 A | 10/1994 | Williams et al. | |
| 5,521,035 A | 5/1996 | Wolk et al. | |
| 5,621,131 A | 4/1997 | Krueder et al. | |
| 5,652,600 A | 7/1997 | Khormaei et al. | |
| 5,693,446 A | 12/1997 | Staral et al. | |
| 5,708,130 A | 1/1998 | Woo et al. | |
| 5,725,989 A | 3/1998 | Chang et al. | |
| 5,728,801 A | 3/1998 | Wu et al. | |
| 5,783,115 A | 7/1998 | Bilkadi et al. | |
| 5,840,217 A | 11/1998 | Lupo et al. | |
| 5,869,350 A | 2/1999 | Heeger et al. | |
| 5,900,327 A | 5/1999 | Pei et al. | |
| 5,920,080 A | 7/1999 | Jones | |
| 5,929,194 A | 7/1999 | Woo et al. | |
| 5,998,085 A | 12/1999 | Isberg et al. | |
| 6,030,715 A | 2/2000 | Thompson et al. | |
| 6,057,067 A | 5/2000 | Isberg et al. | |
| 6,111,355 A | 8/2000 | Inoue et al. | |
| 6,114,088 A | 9/2000 | Wolk et al. | |
| 6,117,529 A | 9/2000 | Leising et al. | |
| 6,132,641 A | 10/2000 | Rietz et al. | |
| 6,150,043 A | 11/2000 | Thompson et al. | |
| 6,169,163 B1 | 1/2001 | Woo et al. | |
| 6,221,543 B1 | 4/2001 | Guehler et al. | |
| 6,228,555 B1 | 5/2001 | Hoffend, Jr. et al. | |
| 6,242,115 B1 | 6/2001 | Thompson et al. | |
| 6,284,425 B1 | 9/2001 | Staral et al. | |
| 6,291,116 B1 | 9/2001 | Wolk et al. | |
| 6,329,058 B1 | 12/2001 | Arney et al. | |
| 6,358,664 B1 | 3/2002 | Nirmal et al. | |
| 6,359,337 B1 | 3/2002 | Keukelaar et al. | |
| 6,392,340 B2 | 5/2002 | Yoneda et al. | |
| 6,410,201 B2 | 6/2002 | Wolk et al. | |
| 6,432,526 B1 | 8/2002 | Arney et al. | |
| 6,461,775 B1 | 10/2002 | Pokorny et al. | |
| 6,485,884 B2 | 11/2002 | Wolk et al. | |
| 6,521,035 B1 | 2/2003 | Shiraishi | |
| 6,522,067 B1 | 2/2003 | Graff et al. | |
| 6,552,488 B1 | 4/2003 | Reitman et al. | |
| 6,563,263 B1 | 5/2003 | Kawaguchi et al. | |
| 6,580,214 B2 | 6/2003 | Yoneda et al. | |
| 6,582,876 B2 | 6/2003 | Wolk et al. | |
| 6,586,153 B2 | 7/2003 | Wolk et al. | |
| 6,608,439 B1 | 8/2003 | Sokolik et al. | |
| 6,642,652 B2 * | 11/2003 | Collins et al. | 313/512 |
| 6,689,538 B2 | 2/2004 | Hoffend, Jr. et al. | |
| 7,053,255 B2 | 5/2006 | Ikeda et al. | |
| 2001/0010884 A1 | 8/2001 | Guehler et al. | |
| 2001/0036561 A1 | 11/2001 | Wolk et al. | |
| 2001/0043043 A1 * | 11/2001 | Aoyama et al. | 313/506 |
| 2002/0015907 A1 | 2/2002 | Wolk et al. | |
| 2002/0160296 A1 | 10/2002 | Wolk et al. | |
| 2002/0164535 A1 * | 11/2002 | Hoffend et al. | 430/20 |
| 2002/0172887 A1 | 11/2002 | Wolk et al. | |
| 2002/0197554 A1 | 12/2002 | Wolk et al. | |
| 2003/0124265 A1 | 7/2003 | Bellmann et al. | |
| 2003/0146696 A1 | 8/2003 | Park et al. | |
| 2003/0222577 A1 * | 12/2003 | Lu | 313/504 |
| 2004/0069995 A1 | 4/2004 | Magno et al. | |
| 2004/0135502 A1 | 7/2004 | Kobayashi et al. | |
| 2004/0195967 A1 | 10/2004 | Padiyath et al. | |
| 2004/0233139 A1 * | 11/2004 | Asano et al. | 345/76 |
| 2005/0062407 A1 | 3/2005 | Suh et al. | |
| 2005/0093434 A1 | 5/2005 | Suh et al. | |
| 2005/0093435 A1 | 5/2005 | Suh et al. | |
| 2005/0116621 A1 | 6/2005 | Bellman et al. | |
| 2005/0127824 A1 * | 6/2005 | Mori et al. | 313/504 |

FOREIGN PATENT DOCUMENTS

| | | |
|---|---|---|
| EP | 0616488 | 5/1998 |
| EP | 0 866 644 | 9/1998 |
| EP | 1052708 | 11/2000 |
| EP | 1 187 235 A2 | 3/2002 |
| EP | 1 220 191 A2 | 7/2002 |
| EP | 1 220 191 A3 | 7/2002 |
| EP | 1 248 121 A1 | 10/2002 |
| JP | 1997080434 A | 3/1997 |
| JP | 1997092466 A | 4/1997 |
| JP | 10 092580 | 4/1998 |
| JP | 1998223367 A | 8/1998 |
| JP | 11-195488 | 7/1999 |
| JP | 1999329742 A | 11/1999 |
| JP | 2000-195673 | 7/2000 |
| JP | 200208257 A | 7/2000 |
| JP | 200284705 A | 10/2000 |
| JP | 2002071931 A | 3/2002 |
| JP | 2002151262 A | 5/2002 |
| JP | 2002260866 A | 9/2002 |
| JP | 20002260845 A | 9/2002 |
| JP | 2002-75636 | 3/2003 |
| JP | 2003-229271 | 8/2003 |
| JP | 2003-243154 | 8/2003 |
| JP | 2003-257666 | 9/2003 |
| JP | 2004-207065 | 7/2004 |
| WO | WO 98/55561 | 12/1998 |
| WO | WO 99/40655 | 8/1999 |
| WO | WO 00/18851 | 4/2000 |
| WO | WO 00/70655 | 11/2000 |
| WO | WO 02/22374 | 3/2002 |
| WO | WO 03-069957 | 8/2003 |

OTHER PUBLICATIONS

Benenson et al., "Geometric Optics," Chapter 11.1, *Handbook of Physics*, Springer, NY, 2001.

Jean-Pierre Budin, "Alternating Current Thin Film Elkectroluminescent Displays (ACTFEL)," *Display Systems Design and Applications*, John Wiley & Sons, 1997, pp. 192-201.

LeMaitre et al., "Colour by Blue Approach for Full-Colour Organic Light Emitting Displays", Organic Devices Laboratory, C. W. Tang and S. A. Vanslyke, *Appl. Phys. Lett.* 1987, 51, 913.

Fetsko, NPIRI Raw Materials Data Handbook, vol. 4 (Pigments), Bethlehem, PA 1983; cover page, title page and table of contents only, 4 pgs.

Chen et al., Recent Developments in Molecular Organic Electroluminescent Materials, *Macromol. Symp.*, 125:1 (1997).

Kashiwabara et al., "29.5L : Late-News Paper: Advanced AM-OLED Display Based on White Emitter with Microcavity Structure," SID 04 Digest, p. 1017-1019, (May 2004).

Kraft, et al., *Angew. Chem. Int. Ed.*, 37, 402-428 (1998).

Nalwa et al., *Handbook of Luminescence, Display Materials and Devices*, Stevens Ranch, CA, American Scientific Publishers, 2003, p. 132-195.

From the Planar website—discussion of thin film EL technology < http://www.planar.com/Advantages/Technology/ContribList/ Electroluminescent.html>, Mar. 17, 2005.

Shinar, Joseph, ed., *Organic Light-Emitting Devices*, Berlin, Springer Verlag, 2003, p. 43-69.

Bellman, Erika, et al.; U.S. Appl. No. 10/989,526; "A Method of Making an Electroluminescent Device Including a Color Filter"; filed Nov. 16, 2004.

Wolk, Martin B., et al., U.S. Appl. No. 11/204,202, "Electroluminescent Devices and Methods of Making Electroluminescent Devices Including an Optical Spacer", filed Dec. 28, 2004.

* cited by examiner

ELECTROLUMINESCENT DEVICES AND METHODS OF MAKING ELECTROLUMINESCENT DEVICES INCLUDING A COLOR CONVERSION ELEMENT

This application claims the benefit of U.S. Provisional Application No. 60/520,997, filed Nov. 18, 2003, which is incorporated herein by reference in its entirety.

FIELD OF THE INVENTION

Generally, the present disclosure relates to electroluminescent devices. In particular, the present disclosure relates to electroluminescent devices and methods of forming electroluminescent devices that include an electroluminescent element and at least one color conversion element.

BACKGROUND

Light emitting devices, such as organic or inorganic electroluminescent devices, are useful in a variety of display, lighting, and other applications. Generally, these light emitting devices include one or more devices layers, including at least one light emitting layer, disposed between two electrodes (an anode and a cathode). A voltage drop or current is provided between the two electrodes, thereby causing a light emitting material, which can be organic or inorganic, in the light emitting layer to luminesce. Typically, one or both of the electrodes is transparent so that light can be transmitted through the electrode to a viewer or other light receiver.

An electroluminescent device may be constructed such that it is either a top emitting device or a bottom emitting device. In a top emitting electroluminescent device, the light emitting layer or layers are positioned between the substrate and a viewer. In a bottom emitting electroluminescent device, a transparent or semitransparent substrate is positioned between the light emitting layer or layers and the viewer.

In a typical color electroluminescent display, one or more electroluminescent devices can be formed on a single substrate and arranged in groups or arrays. Several approaches exist for producing a color electroluminescent display. For example, one approach includes an array having red, green, and blue electroluminescent device subpixels placed next to each other. Another approach, for example, uses color conversion to produce a color electroluminescent display. Displays that utilize color conversion can include electroluminescent devices that emit light in a narrow band, e.g., blue light. Each color conversion electroluminescent device also includes one or more color conversion elements in optical association with the electroluminescent device such that the emitted light (e.g., blue light) is converted, e.g., to red light by a red color conversion element and green light by a green color conversion element.

SUMMARY

The present disclosure provides methods of making electroluminescent devices that include color conversion elements in optical association with an electroluminescent element. In particular, the present disclosure provides techniques that include selective thermal transfer (e.g., Laser Induced Thermal Imaging (LITI)) of color conversion elements for use in electroluminescent devices.

Patterning of red-, green-, and blue-emitting primary organic light emitting diode (OLED) materials for full color devices has proven to be difficult. Many techniques have been described for such patterning, including laser thermal patterning, ink jet patterning, shadow mask patterning, and photolithographic patterning.

Alternative techniques of providing a full color display without patterning the emitting materials include the use of color conversion as described herein. However, the use of these alternative techniques with the traditional bottom emitting electroluminescent device construction is limited by physical and optical factors. For practical reasons, the color conversion elements must be patterned either on a separate piece of glass or on the substrate. In this case, the effect of the distance between the light emitting layer and the filter layer leads to parallax problems. In other words, Lambertian emission from the electroluminescent device allows the light to reach the corresponding color conversion element as well as a number of adjacent color conversion elements. As a result, the color saturation level of the electroluminescent display is reduced.

On the other hand, top emitting electroluminescent devices may allow for more complex pixel control circuitry as well as more flexibility in the choice of semiconductor and substrate. In a typical top emitting device, the electroluminescent device layers can be deposited onto a substrate, followed by the formation of a thin, transparent metal electrode, and a protective layer.

In some embodiments, the present disclosure provides selective thermal transfer (e.g., LITI) techniques for forming top emitting electroluminescent devices that include color conversion elements that are formed on the top electrode of an electroluminescent element or on a protective layer formed over the electroluminescent element. The present disclosure also provides selective thermal transfer (e.g., LITI) techniques for forming bottom emitting electroluminescent devices that include color conversion elements formed on a substrate surface opposite an electroluminescent element. Providing color conversion elements directly on the top electrode or on a protective layer may help to eliminate alignment difficulties and parallax problems.

Further, selective thermal transfer patterning (e.g., LITI patterning, which is a dry, digital method), may be more compatible with the materials used, e.g., for organic electroluminescent devices. Because it is a dry technique, selective thermal transfer may also allow for patterning of multiple layers on a single substrate without concern for the relative solubility of each layer.

In addition, selective thermal transfer patterning of color conversion elements may provide a technique that is more easily reversible. For example, if the pattern of the color conversion elements does not pass quality control inspection, the elements can be washed off and formed again without undue harm to the electroluminescent element.

In one aspect, the present disclosure provides a method of making an electroluminescent device. The method includes forming an electroluminescent element on a substrate, where the electroluminescent element is capable of emitting, and preferably emits light in a narrow band. The method further includes selectively thermally transferring a plurality of color conversion elements to the electroluminescent element.

In another aspect, the present disclosure provides a method of making an electroluminescent device. The method includes forming an electroluminescent element on a first major surface of a substrate, where the electroluminescent element capable of emitting, and preferably emits light in a narrow band. The method further includes selectively thermally transferring a plurality of color conversion elements to a second major surface of the substrate.

In another aspect, the present disclosure provides a method of making an electroluminescent device. The method includes forming an electroluminescent element on a substrate, where the electroluminescent element is capable of emitting, and preferably emits light in a narrow band. The method further includes forming a protective layer over at least a portion of the electroluminescent element; and selectively thermally transferring a plurality of color conversion elements to the protective layer.

In another aspect, the present disclosure provides a method of making an electroluminescent color display including at least one electroluminescent device. The method includes forming the at least one electroluminescent device on a substrate. Forming the at least one electroluminescent device includes forming an electroluminescent element on the substrate, where the electroluminescent element is capable of emitting, and preferably emits light in a narrow band; and selectively thermally transferring a plurality of color conversion elements to the electroluminescent element.

In another aspect, the present disclosure provides a method of making an electroluminescent device. The method includes forming an electroluminescent element on a substrate, where the electroluminescent element is capable of emitting, and preferably emits UV light. The method further includes selectively thermally transferring a plurality of color conversion elements to the electroluminescent element.

In another aspect, the present disclosure provides an electroluminescent device. The device includes: a substrate; an electroluminescent element on the substrate, where the electroluminescent element is capable of emitting, and preferably emits light in a narrow band; a plurality of color conversion elements on the electroluminescent element; and at least one color filter on at least one color conversion element of the plurality of color conversion elements.

As used herein, "a," "an," "the," "at least one," and "one or more" are used interchangeably.

The above summary of the present invention is not intended to describe each disclosed embodiment or every implementation of the present invention. The Figures and the detailed description that follow more particularly exemplify illustrative embodiments.

BRIEF DESCRIPTION OF THE DRAWINGS

FIG. 5(*a*) illustrates selectively heating the donor element. FIG. 5(*b*) illustrates an imagewise formed pattern of the transferred emissive material (e.g., a plurality of color conversion elements).

DETAILED DESCRIPTION

In the following detailed description of illustrative embodiments, reference is made to the accompanying drawings that form a part hereof, and in which are shown, by way of illustration, specific embodiments in which the invention may be practiced. It is to be understood that other embodiments may be utilized and structural changes may be made without departing from the scope of the present invention.

The present disclosure is believed to be applicable to electroluminescent devices and methods of making electroluminescent devices. Electroluminescent devices can include organic or inorganic light emitters or combinations of both types of light emitters. An organic electroluminescent (OEL) display or device refers to an electroluminescent display or device that includes at least one organic emissive material, whether that emissive material is a small molecule (SM) emitter (e.g., nonpolymeric emitter), a SM doped polymer, a SM blended polymer, a light emitting polymer (LEP), a doped LEP, a blended LEP, or another organic emissive material whether provided alone or in combination with any other organic or inorganic materials that are functional or non-functional in the OEL display or devices. Inorganic light emissive materials include phosphors, semiconductor nanocrystals, etc.

Generally, electroluminescent devices have one or more device layers, including at least one light emitting layer, disposed between two electrodes (an anode and a cathode). A voltage drop or current is provided between the two electrodes, thereby causing the light emitter to luminesce.

Electroluminescent devices can also include thin film electroluminescent displays or devices. A thin film electroluminescent device includes an emissive material sandwiched between transparent dielectric layers and a matrix of row and column electrodes. Such thin film electroluminescent displays may include those described, e.g., in U.S. Pat. No. 4,897,319 (Sun) and U.S. Pat. No. 5,652,600 (Khormaei et al.).

Figure 1:
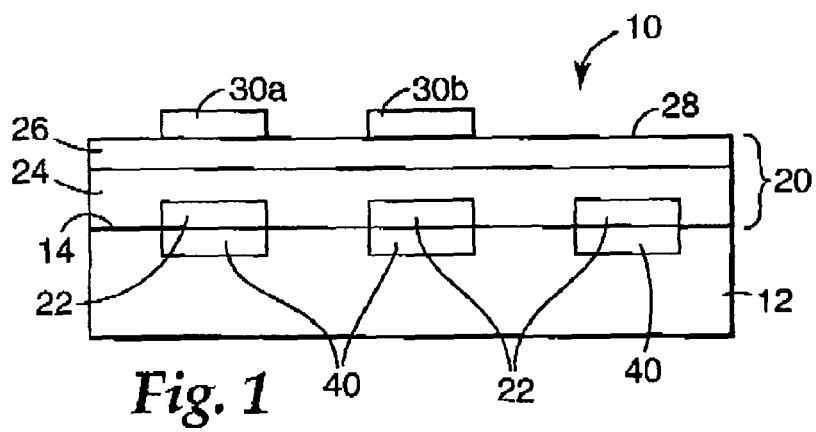
FIG. 1 is a schematic diagram of one embodiment of a top emitting electroluminescent device that includes color conversion elements formed on an electroluminescent element.

FIG. 1 is a schematic diagram of one embodiment of an electroluminescent device 10. The electroluminescent device 10 includes a substrate 12, an electroluminescent element 20 formed on a major surface 14 of the substrate 12, and color conversion elements 30*a* and 30*b* (hereinafter referred to collectively as color conversion elements 30) formed on the electroluminescent element 20. The electroluminescent element 20 includes a first electrode 22, a second electrode 26, and one or more device layers 24 positioned between the first electrode 22 and the second electrode 26.

The substrate 12 of device 10 can be any substrate suitable for electroluminescent device or display applications. For example, the substrate 12 can be made of glass, clear plastic, or other suitable material(s) that are substantially transparent to visible light. The substrate 12 can also be opaque to visible light, for example stainless steel, crystalline silicon, poly-silicon, or the like. In some instances, the first electrode 22 can be the substrate 12. Because materials used in at least some electroluminescent devices can be particularly susceptible to damage due to exposure to oxygen or water, a suitable substrate can be selected to provide an adequate environmental barrier, or is supplied with one or more layers, coatings, or laminates that provide an adequate environmental barrier.

The substrate 12 can also include any number of devices or components suitable in electroluminescent devices and displays, such as transistor arrays and other electronic devices; color filters, polarizers, wave plates, diffusers, and other optical devices; insulators, barrier ribs, black matrix, mask work, and other such components; and the like. The substrate 12 may also include a plurality of independently addressable active devices 40 as is described, e.g., in European Patent Application No. 1,220,191 (Kwon).

The electroluminescent device 10 also includes an electroluminescent element 20 formed on major surface 14 of the substrate 12. Although FIG. 1 illustrates electroluminescent element 20 as being formed on and in contact with major surface 14 of substrate 12, one or more layers or devices may be included between the electroluminescent element 20 and the major surface 14 of substrate 12. The electroluminescent element 20 includes a first electrode 22, a second electrode 26, and one or more device layers 24 positioned between the first electrode 22 and the second electrode 26. The first electrode 22 can be the anode and the second electrode 26 can be the cathode, or the first electrode 22 can be the cathode and the second electrode 26 can be the anode.

The first electrode 22 and the second electrode 26 are typically formed using electrically conducting materials such as metals, alloys, metallic compounds, metal oxides, conductive ceramics, conductive dispersions, and conductive polymers. Examples of suitable materials include, for example, gold, platinum, palladium, aluminum, calcium, titanium, titanium nitride, indium tin oxide (ITO), fluorine tin oxide (FTO), and polyaniline. The first and second electrodes 22 and 26 can be single layers of conducting materials or they can include multiple layers. For example, either one or both of the first electrode 22 and the second electrode 26 can include a layer of aluminum and a layer of gold, a layer of calcium and a layer of aluminum, a layer of aluminum and a layer of lithium fluoride, or a metal layer and a conductive organic layer.

Formed between the first electrode 22 and the second electrode 26 are the one or more device layers 24. The one or more device layers 24 include a light emitting layer. Optionally, the one or more device layers 24 can include one or more additional layers such as, for example, a hole transport layer or layers, an electron transport layer or layers, a hole injection layer or layers, an electron injection layer or layers, a hole blocking layer or layers, an electron blocking layer or layers, a buffer layer or layers, or any combination thereof.

The light emitting layer includes light emitting material. Any suitable light emitting material may be used in the light emitting layer. A variety of light emitting materials, including LEP and SM light emitters, can be used. The light emitters include, for example, fluorescent and phosphorescent materials. Examples of classes of suitable LEP materials include poly(phenylenevinylene)s (PPVs), poly-para-phenylenes (PPPs), polyfluorenes (PFs), other LEP materials now known or later developed, and co-polymers or blends thereof. Suitable LEPs can also be molecularly doped, dispersed with fluorescent dyes or other materials, blended with active or non-active materials, dispersed with active or non-active materials, and the like. Examples of suitable LEP materials are described in Kraft, et al., *Angew. Chem. Int. Ed.*, 37, 402-428 (1998); U.S. Pat. No. 5,621,131 (Kreuder et al.); U.S. Pat. No. 5,708,130 (Woo et al.); U.S. Pat. No. 5,728,801 (Wu et al.); U.S. Pat. No. 5,840,217 (Lupo et al.); U.S. Pat. No. 5,869,350 (Heeger et al.); U.S. Pat. No. 5,900,327 (Pei et al.); U.S. Pat. No. 5,929,194 (Woo et al.); U.S. Pat. No. 6,132,641 (Rietz et al.); and U.S. Pat. No. 6,169,163 (Woo et al.); and PCT Patent Application Publication No. 99/40655 (Kreuder et al.).

SM materials are generally non-polymeric organic or organometallic molecular materials that can be used in OEL displays and devices as emitter materials, charge transport materials, as dopants in emitter layers (e.g., to control the emitted color) or charge transport layers, and the like. Commonly used SM materials include metal chelate compounds, such as tris(8-hydroxyquinoline) aluminum (AlQ), and N,N'-bis(3-methylphenyl)-N,N'-diphenylbenzidine (TPD). Other SM materials are disclosed in, for example, C. H. Chen, et al., *Macromol. Symp.*, 125:1 (1997); Japanese Laid Open Patent Application 2000-195673 (Fujii); U.S. Pat. No. 6,030,715 (Thompson et al.); U.S. Pat. No. 6,150,043 (Thompson et al.); and U.S. Pat. No. 6,242,115 (Thomson et al.); and PCT Patent Application Publication Nos. WO 00/18851 (Shipley et al.) (divalent lanthanide metal complexes), WO 00/70655 (Forrest et al.) (cyclometallated iridium compounds and others), and WO 98/55561 (Christou).

The one or more device layers 24 may also include a hole transport layer. The hole transport layer facilitates the injection of holes from an anode into the electroluminescent element 20 and their migration towards a recombination zone. The hole transport layer can further act as a barrier for the passage of electrons to the anode. Any suitable material or materials may be used for the hole transport layer, e.g., those materials described in Nalwa et al., *Handbook of Luminescence, Display Materials and Devices*, Stevens Ranch, Calif., American Scientific Publishers, 2003, p. 132-195; Chen et al., *Recent Developments in Molecular Organic Electroluminescent Materials*, *Macromol. Symp.*, 1:125 (1997); and Shinar, Joseph, ed., *Organic Light-Emitting Devices*, Berlin, Springer Verlag, 2003, p. 43-69.

The one or more device layers 24 can also include an electron transport layer. The electron transport layer facilitates the injection of electrons and their migration towards the recombination zone. The electron transport layer can further act as a barrier for the passage of holes to a cathode if desired. Any suitable material or materials may be used for the electron transport layer, e.g., those materials described in Nalwa et al., *Handbook of Luminescence, Display Materials and Devices*, Stevens Ranch, Calif., American Scientific Publishers, 2003, p. 132-195; Chen et al., *Recent Developments in Molecular Organic Electroluminescent Materials, Macromol. Symp.*, 1:125 (1997); and Shinar, Joseph, ed., *Organic Light-Emitting Devices*, Berlin, Springer Verlag, 2003, p. 43-69.

It may be preferred that the electroluminescent element 20 be capable of emitting light in a narrow band. As used herein, the term "light in a narrow band" refers to a light spectrum that has a spectral width (measured at the half-power points of the spectrum) of no more than about 100 nm. A narrow band emitter, therefore, is a light source that emits light having a spectral width of no more than 100 nm. For example, it may be preferred that the electroluminescent element 20 be capable of emitting blue light. Those skilled in the art will understand that materials for the light emitting layer of the electroluminescent element 20 may be selected such that the electroluminescent element 20 is capable of emitting light in a narrow band, e.g., blue light.

Alternatively, in some embodiments, it may be preferred that the electroluminescent element 20 be capable of emitting ultraviolet (UV) light. Both UV and blue light can be "downconverted" to light of a lower frequency by use of downconverting phosphors. For UV emitting electroluminescent elements, it may be preferred that at least three color conversion elements 30 be formed on the electroluminescent element 20 as further described herein.

The one or more device layers 24 can be formed between the first electrode 22 and the second electrode 26 by a variety of methods, e.g., coating (e.g., spin coating), printing (e.g., screen printing or ink jet printing), physical or chemical vapor deposition, photolithography, and thermal transfer methods (e.g., methods described in U.S. Pat. No. 6,114,088 (Wolk et al.)). The one or more device layers 24 can be formed sequentially, or two or more of the layers can be disposed simultaneously. After formation of the one or more device layers 24 or simultaneously with deposition of the device layers 24, the second electrode 26 is formed or otherwise disposed on the one or more device layers 24. Alternatively, the electroluminescent element 20 may be formed using LITI techniques that include a multilayer donor sheet as described, e.g., in U.S. Pat. No. 6,114,088 (Wolk et al.)).

Electroluminescent element 20 may also include a protective layer or layers formed over the electroluminescent element 20 (not shown) as is further described herein.

The electroluminescent device 10 also includes color conversion elements 30 formed on the electroluminescent element 20. Although color conversion elements 30 are illustrated as being formed on the second electrode 26, one or more layers or devices may be included between the color conversion elements 30 and the second electrode 26. One, two, or more color conversion elements 30 may be formed on the electroluminescent element 20 such that at least a portion of light emitted from the electroluminescent element 20 is incident upon one or more color conversion elements 30. In other words, the color conversion elements 30 are in optical association with the electroluminescent element 20. The color conversion elements 30 absorb light incident thereon and reemit light in a selected narrow band. For example, color conversion element 30a may convert incident light into red light, and color conversion element 30b may convert incident light into green light. As used herein, the term "red light" refers to light having a spectrum predominantly in an upper portion of the visible spectrum. As further used herein, the term "green light" refers to light having a spectrum predominantly in a middle portion of the visible spectrum. And "blue light" refers to light having a spectrum predominantly in a lower portion of the visible spectrum. In some embodiments, color conversion elements 30 may also include a color conversion element that converts incident light into blue light. In contrast to color conversion elements, color filters (as further described herein) attenuate particular wavelengths or frequencies while passing others with relatively no change in wavelength.

Although not shown in FIG. 1, one or more color conversion elements may be formed on one or more other color conversion elements. For example, a red color conversion element may be formed on a green color conversion element such that the red color conversion element absorbs green light emitted from the green color conversion element and reemits red light.

Color conversion elements 30 may include any suitable material or materials. For example, color conversion elements 30 may include any suitable color conversion material, e.g., fluorescent dyes, fluorescent pigments phosphors, semiconducting nanocrystals, etc. These color conversion materials may be dispersed in any suitable binder material, e.g., monomeric, oligomeric, polymeric, etc.

Color conversion elements 30 may be formed on electroluminescent element 20 using any suitable technique, e.g., coating (e.g., spin coating), printing (e.g., screen printing or ink jet printing), physical or chemical vapor deposition, photolithography, and thermal transfer methods (e.g., methods described in U.S. Pat. No. 6,114,088 (Wolk et al.))). It may be preferred that color conversion elements 30 are formed on electroluminescent element 20 using LITI techniques as further described herein.

Figure 5A:
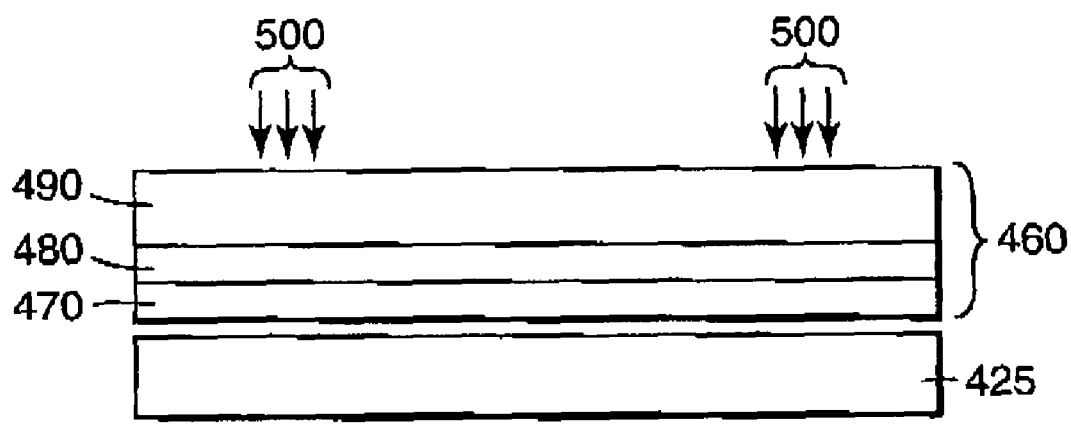
FIG. 5 is a schematic diagram of an embodiment of a method of transferring emissive material to a receptor substrate.
Figure 5B:
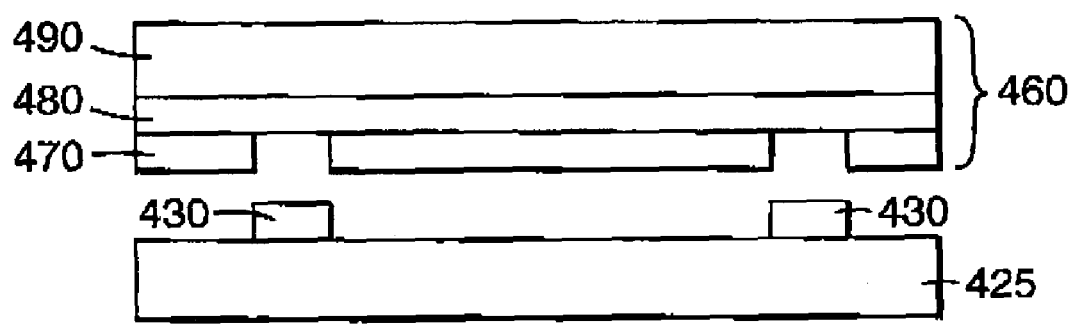

Referring to FIG. 5 (a), in processes of the present disclosure, emissive materials 430, including light emitting polymers (LEPs) or other materials, color conversion elements, and color filters, can be selectively transferred from the transfer layer 470 of a donor sheet to a receptor substrate 425 by placing the transfer layer 470 of the donor element 460 adjacent to the receptor 425 (e.g., the electroluminescent element 20) and selectively heating 500 the donor element 460. See, for example, U.S. Patent Application Publication No. 2005/0118923 A1 (Bellmann et al.) for examples of selective transfer of a color filter. Illustratively, the donor element 460 can be selectively heated by irradiating the donor element with imaging radiation that can be absorbed by light-to-heat converter (LTHC) material disposed in the donor, often in a separate LTHC layer 480, and converted into heat. Alternatively, light-to-heat conversion can occur in any one or more of the layers in either the donor element or the receptor substrate. The donor can be exposed to imaging radiation through the donor substrate 490, through the receptor 425, or both. The radiation can include one or more wavelengths, including visible light, infrared radiation, or ultraviolet radiation, for example from a laser, lamp, or other such radiation source. Other selective heating techniques can also be used, such as using a thermal print head or using a thermal hot stamp (e.g., a patterned thermal hot stamp such as a heated silicone stamp that has a relief pattern that can be used to selectively heat a donor). Referring to FIG. 5(b), material from the thermal transfer layer 470 can be selectively transferred to a receptor 425 in this manner to imagewise form patterns of the transferred material 430 on the receptor 425. In many instances, thermal transfer using light from, for example, a lamp or laser, to patternwise expose the donor can be advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the donor sheet, or the materials of the donor sheet. The transferred pattern can also be controlled by irradiating the donor element through a mask.

As mentioned, a thermal print head or other heating element (patterned or otherwise) can also be used to selectively heat the donor element directly, thereby pattern-wise transferring portions of the transfer layer. In such cases, the light-to-heat converter material in the donor sheet is optional. Thermal print heads or other heating elements may be particularly suited for making lower resolution patterns of material or for patterning elements whose placement need not be precisely controlled.

Transfer layers can also be transferred in their entirety from donor sheets. For example, a transfer layer can be formed on a donor substrate that, in essence, acts as a temporary liner that can be released after the transfer layer is contacted to a receptor substrate, typically with the application of heat or pressure. Such a method, referred to as lamination transfer, can be used to transfer the entire transfer layer, or a large portion thereof, to the receptor.

The mode of thermal transfer can vary depending on the type of selective heating employed, the type of irradiation if used to expose the donor, the type of materials and properties of the optional LTHC layer, the type of materials in the transfer layer, the overall construction of the donor, the type of receptor substrate, and the like. Without wishing to be bound by any theory, transfer generally occurs via one or more mechanisms, one or more of which may be emphasized or de-emphasized during selective transfer depending on imaging conditions, donor constructions, and so forth. One mechanism of thermal transfer includes thermal melt-stick transfer whereby heating at the interface between the thermal transfer layer and the rest of the donor element results in adherence to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimated by heat generated in the donor element. A portion of the sublimated material can condense on the receptor. The present invention contemplates transfer modes that include one or more of these and other mechanisms whereby selective heating of a donor sheet can be used to cause the transfer of materials from a transfer layer to receptor surface.

A variety of radiation-emitting sources can be used to heat donor sheets. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geq 100$ mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more. Other radiation sources and irradiation conditions can be suitable based on, among other things, the donor element construction, the transfer layer material, the mode of thermal mass transfer, and other such factors.

When high spot placement accuracy is desired (e.g., when patterning elements for high information content displays and other such applications) over large substrate areas, a laser can be particularly useful as the radiation source. Laser sources are also compatible with both large rigid substrates (e.g., 1 m×1 m×1.1 mm glass) and continuous or sheeted film substrates (e.g., 100 μm thick polyimide sheets).

During imaging, the donor sheet can be brought into intimate contact with a receptor (as might typically be the case for thermal melt-stick transfer mechanisms) or the donor sheet can be spaced some distance from the receptor (as can be the case for ablative transfer mechanisms or material sublimation transfer mechanisms). In at least some instances, pressure or vacuum can be used to hold the donor sheet in intimate contact with the receptor. In some instances, a mask can be placed between the donor sheet and the receptor. Such a mask can be removable or can remain on the receptor after transfer. If a light-to-heat converter material is present in the donor, radiation source can then be used to heat the LTHC layer (or other layer(s) containing radiation absorber) in an imagewise fashion (e.g., digitally or by analog exposure through a mask) to perform imagewise transfer or patterning of the transfer layer from the donor sheet to the receptor.

Typically, selected portions of the transfer layer are transferred to the receptor without transferring significant portions of the other layers of the donor sheet, such as an optional interlayer or LTHC layer as is further described herein. The presence of the optional interlayer may eliminate or reduce the transfer of material from an LTHC layer or other proximate layers (for example, other interlayers) to the receptor or reduce distortion in the transferred portion of the transfer layer. Preferably, under imaging conditions, the adhesion of the optional interlayer to the LTHC layer is greater than the adhesion of the interlayer to the transfer layer. The interlayer can be transmissive, reflective, or absorptive to imaging radiation, and can be used to attenuate or otherwise control the level of imaging radiation transmitted through the donor or to manage temperatures in the donor, for example to reduce thermal or radiation-based damage to the transfer layer during imaging. Multiple interlayers can be present.

Large donor sheets can be used, including donor sheets that have length and width dimensions of a meter or more. In operation, a laser can be rastered or otherwise moved across the large donor sheet, the laser being selectively operated to illuminate portions of the donor sheet according to a desired pattern. Alternatively, the laser may be stationary and the donor sheet or receptor substrate moved beneath the laser.

In some instances, it may be necessary, desirable, or convenient to sequentially use two or more different donor sheets to form electronic devices on a receptor. For example, multiple layer devices can be formed by transferring separate layers or separate stacks of layers from different donor sheets. Multilayer stacks can also be transferred as a single transfer unit from a single donor element as is described, e.g., in U.S. Pat. No. 6,114,088 (Wolk et al.)). For example, a hole transport layer and a LEP layer can be co-transferred from a single donor. As another example, a semiconductive polymer and an emissive layer can be co-transferred from a single donor. Multiple donor sheets can also be used to form separate components in the same layer on the receptor. For example, three different donors that each have a transfer layer including a color conversion element capable of emitting a different color (for example, red, green, and blue) can be used to form RGB color conversion electroluminescent devices for a full color polarized light emitting electronic display. As another example, a conductive or semiconductive polymer can be patterned via thermal transfer from one donor, followed by selective thermal transfer of emissive layers from one or more other donors to form a plurality of OEL devices in a display. As still another example, layers for organic transistors can be patterned by selective thermal transfer of electrically active organic materials (oriented or not), followed by selective thermal transfer patterning of one or more pixel or sub-pixel elements such as color conversion elements, color filters, emissive layers, charge transport layers, electrode layers, and the like.

Materials from separate donor sheets can be transferred adjacent to other materials on a receptor to form adjacent devices, portions of adjacent devices, or different portions of the same device. Alternatively, materials from separate donor sheets can be transferred directly on top of, or in partial overlying registration with, other layers or materials previously patterned onto the receptor by thermal transfer or some other method (e.g., photolithography, deposition through a shadow mask, etc.). A variety of other combinations of two or more donor sheets can be used to form a device, each donor sheet used to form one or more portions of the device. It will be understood that other portions of these devices, or other devices on the receptor, may be formed in whole or in part by any suitable process including photolithographic processes, ink jet processes, and various other printing or mask-based processes, whether conventionally used or newly developed.

The donor substrate can be a polymer film. One suitable type of polymer film is a polyester film, for example, polyethylene terephthalate (PET) or polyethylene naphthalate (PEN) films. However, other films with sufficient optical properties, including high transmission of light at a particular wavelength, or sufficient mechanical and thermal stability properties, depending on the particular application, can be used. The donor substrate, in at least some instances, is flat so that uniform coatings can be formed thereon. The donor substrate is also typically selected from materials that remain stable despite heating of one or more layers of the donor. However, as described herein, the inclusion of an underlayer between the substrate and an LTHC layer can be used to insulate the substrate from heat generated in the LTHC layer during imaging. The typical thickness of the donor substrate ranges from 0.025 to 0.15 mm, preferably 0.05 to 0.1 mm, although thicker or thinner donor substrates may be used.

The materials used to form the donor substrate and an optional adjacent underlayer can be selected to improve adhesion between the donor substrate and the underlayer, to control heat transport between the substrate and the underlayer, to control imaging radiation transport to the LTHC layer, to reduce imaging defects and the like. An optional priming layer can be used to increase uniformity during the coating of subsequent layers onto the substrate and also increase the bonding strength between the donor substrate and adjacent layers.

An optional underlayer may be coated or otherwise disposed between a donor substrate and the LTHC layer, for example to control heat flow between the substrate and the LTHC layer during imaging or to provide mechanical stability to the donor element for storage, handling, donor processing, or imaging. Examples of suitable underlayers and techniques of providing underlayers are disclosed in U.S. Pat. No. 6,284,425 (Staral et al.).

The underlayer can include materials that impart desired mechanical or thermal properties to the donor element. For example, the underlayer can include materials that exhibit a low specific heat×density or low thermal conductivity relative to the donor substrate. Such an underlayer may be used to increase heat flow to the transfer layer, for example to improve the imaging sensitivity of the donor.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, that might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation or reflection of imaging radiation by the underlayer may be used to control heat generation during imaging.

An LTHC layer can be included in donor sheets of the present invention to couple irradiation energy into the donor sheet. The LTHC layer preferably includes a radiation absorber that absorbs incident radiation (e.g., laser light) and converts at least a portion of the incident radiation into heat to enable transfer of the transfer layer from the donor sheet to the receptor.

Generally, the radiation absorber(s) in the LTHC layer absorb light in the infrared, visible, or ultraviolet regions of the electromagnetic spectrum and convert the absorbed radiation into heat. The radiation absorber(s) are typically highly absorptive of the selected imaging radiation, providing an LTHC layer with an optical density at the wavelength of the imaging radiation in the range of about 0.2 to 3 or higher. Optical density of a layer is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in U.S. Pat. No. 6,228,555 (Hoffend, Jr., et al.), non-homogeneous LTHC layers can be used to control temperature profiles in donor elements. This can give rise to donor sheets that have improved transfer properties (e.g., better fidelity between the intended transfer patterns and actual transfer patterns).

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, black body absorbers, and other suitable absorbing materials. Examples of suitable radiation absorbers include carbon black, metal oxides, and metal sulfides. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 μm or less, and may be about 1 μm or less. Suitable dyes include those dyes that absorb in the IR region of the spectrum. A specific dye may be chosen based on factors such as, solubility in, and compatibility with, a specific binder or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. No. 5,166,024 (Bugner et al.) and U.S. Pat. No. 5,351,617 (Williams et al.). Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252, 671 (Smith), or as films, as disclosed in U.S. Pat. No. 5,256,506 (Ellis et al.). Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers or oligomers with optional polymer.

The inclusion of a thermoplastic resin (e.g., polymer) may improve, in at least some instances, the performance (e.g., transfer properties or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer can be coated, in at least some instances, to a thickness of 0.05 µm to 20 µm, preferably, 0.5 µm to 10 µm, and, more preferably, 1 µm to 7 µm. An inorganic LTHC layer can be coated, in at least some instances, to a thickness in the range of 0.0005 to 10 µm, and preferably, 0.001 to 1 µm.

At least one optional interlayer may be disposed between the LTHC layer and transfer layer. The interlayer can be used, for example, to minimize damage and contamination of the transferred portion of the transfer layer and may also reduce distortion in or mechanical damage of the transferred portion of the transfer layer. The interlayer may also influence the adhesion of the transfer layer to the rest of the donor sheet. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater. In some embodiments, the interlayer includes a thermoplastic material that has a $T_g$ greater than any temperature attained in the transfer layer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. The interlayer may also act as a barrier to prevent any material or contamination exchange to or from layers proximate thereto. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material and properties of the LTHC layer, the material and properties of the transfer layer, the wavelength of the imaging radiation, and the duration of exposure of the donor sheet to imaging radiation. For polymer interlayers, the thickness of the interlayer typically is in the range of 0.05 µm to 10 µm. For inorganic interlayers (e.g., metal or metal compound interlayers), the thickness of the interlayer typically is in the range of 0.005 µm to 10 µm. Multiple interlays can also be used; for example, an organic-based interlayer can be covered by an inorganic-based interlayer to provide additional protection to the transfer layer during the thermal transfer process.

A thermal transfer layer is included in the donor sheet. The transfer layer can include any suitable material or materials, disposed in one or more layers, alone or in combination with other materials. The transfer layer is capable of being selectively transferred as a unit or in portions by any suitable transfer mechanism when the donor element is exposed to direct heating or to imaging radiation that can be absorbed by light-to-heat converter material and converted into heat.

The thermal transfer layer can be used to form, for example, color conversion elements, color filters, electronic circuitry, resistors, capacitors, diodes, rectifiers, electroluminescent lamps, memory elements, field effect transistors, bipolar transistors, unijunction transistors, MOS transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combines, modulators, sensors (e.g., evanescent sensors, phase modulation sensors, interferometric sensors, and the like), optical cavities, piezoelectric devices, ferroelectric devices, thin film batteries, or combinations thereof; for example, the combination of field effect transistors and organic electroluminescent lamps as an active matrix array for an optical display. Other items may be formed by transferring a multi-component transfer unit and/or a single layer.

The transfer layer can be selectively thermally transferred from the donor element to a proximately located receptor substrate. There can be, if desired, more than one transfer layer so that a multilayer construction is transferred using a single donor sheet. The receptor substrate may be any item suitable for a particular application including, but not limited to, glass, transparent films, reflective films, metals, semiconductors, and plastics. For example, receptor substrates may be any type of substrate or display element suitable for display applications, e.g., emissive displays, transmissive displays, transflective displays, electrophoretic displays, and the like. Receptor substrates suitable for use in displays such as liquid crystal displays or emissive displays include rigid or flexible substrates that are substantially transmissive to visible light. Examples of suitable rigid receptors include glass and rigid plastic that are coated or patterned with indium tin oxide or are circuitized with low temperature poly-silicon (LTPS) or other transistor structures, including organic transistors.

Suitable flexible substrates include substantially clear and transmissive polymer films, reflective films, transflective films, polarizing films, multilayer optical films, metallic films, metallic sheets, metallic foils, and the like. Flexible substrates can also be coated or patterned with electrode materials or transistors, for example transistor arrays formed directly on the flexible substrate or transferred to the flexible substrate after being formed on a temporary carrier substrate. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports. For making organic electroluminescent devices on plastic substrates, it is often desirable to include a barrier film or coating on one or both surfaces of the plastic substrate to protect the organic light emitting devices and their electrodes from exposure to undesired levels of water, oxygen, and the like.

Receptor substrates can be pre-patterned with any one or more of electrodes, transistors, capacitors, insulator ribs, spacers, color filters, black matrix, hole transport layers, electron transport layers, and other elements useful for electronic displays or other devices.

A method of making an electroluminescent device will now be described in reference to the electroluminescent device 10 of FIG. 1. The electroluminescent element 20 of device 10 is formed on the major surface 14 of the substrate 12 using any suitable technique, e.g., LITI patterning as described herein. Color conversion elements 30 are selectively thermally transferred to the electroluminescent element 20 as is also described herein. The color conversion elements 30 may be transferred to the electroluminescent element 20 such that the color conversion elements 30 are on the second electrode 26. Alternatively, the color conversion elements 30 may be transferred to a protective layer (not shown) that is formed over at least a portion of the electroluminescent element 20 as is further described herein. In some embodiments, a black matrix may be formed on the electroluminescent element 20 and the color conversion elements 30 then transferred to apertures in the black matrix as is further described herein.

Figure 2:
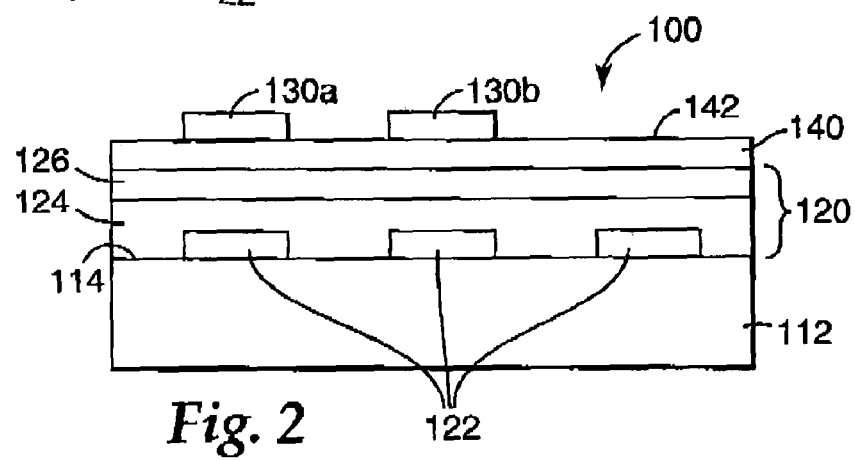
FIG. 2 is a schematic diagram of another embodiment of a top emitting electroluminescent device that includes color conversion elements formed on a protective layer.

FIG. 2 is a schematic diagram of another embodiment of an electroluminescent device 100. The electroluminescent device 100 is similar in many respects to electroluminescent device 10 of FIG. 1. In the embodiment shown in FIG. 2, electroluminescent device 100 includes a substrate 112, an electroluminescent element 120 formed on a major surface 114 of substrate 112, and color conversion elements 130a and 130b (hereinafter referred to collectively as color conversion elements 130) formed on a protective layer 140. The electroluminescent element 120 includes a first electrode 122, a second electrode 126, and one or more device layers 124 positioned between the first electrode 122 and the second electrode 126. All of the design considerations and possibilities described herein with respect to the substrate 12, the electroluminescent element 20, and the color conversion elements 30 of the embodiment illustrated in FIG. 1 apply equally to the substrate 112, the electroluminescent element 120, and the color conversion elements 130 of the embodiment illustrated in FIG. 2.

Electroluminescent device 100 also includes a protective layer 140 formed over at least a portion of the electroluminescent element 120. The protective layer 140 may be formed on and in contact with the electroluminescent element 120. Alternatively, an optional layer or layers may be included between the electroluminescent element 120 and the protective layer 140.

The protective layer 140 may be any suitable type of layer or layers that protect the electroluminescent element 120, e.g., barrier layers, encapsulant layers, etc. The protective layer 140 may be formed using any suitable material or materials, e.g., as described in U.S. patent application Publication No. 2004/0195967 (Padiyath et al.) and U.S. Pat. No. 6,522,067 (Graff et al.).

The color conversion elements 130 are transferred to a major surface 142 of the protective layer 140. As described herein in regard to color conversion elements 30 of electroluminescent device 10 of FIG. 1, the color conversion elements 130 of electroluminescent device 100 may be formed using any suitable technique, e.g., coating (e.g., spin coating), printing (e.g., screen printing or ink jet printing), physical or chemical vapor deposition, photolithography, and thermal transfer methods (e.g., methods described in U.S. Pat. No. 6,114,088 (Wolk et al.))). It may be preferred that the color conversion elements 130 are transferred to the protective layer 140 using LITI techniques as described herein.

Figure 3:
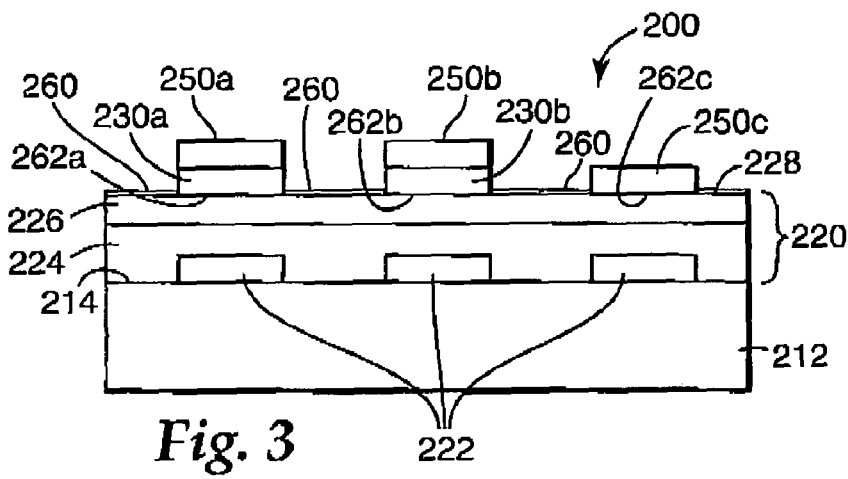
FIG. 3 is a schematic diagram of another embodiment of a top emitting electroluminescent device that includes color conversion elements formed on an electroluminescent element and color filters formed on one or more of the color conversion elements.

Other elements may be formed on the electroluminescent element or protective layer, e.g., black matrix, color filter elements, etc. For example, FIG. 3 is a schematic diagram of another embodiment of an electroluminescent device 200. Electroluminescent device 200 is similar in many respects to electroluminescent device 10 of FIG. 1 and electroluminescent device 100 of FIG. 2. Electroluminescent device 200 includes a substrate 212, an electroluminescent element 220 formed on a major surface 214 of the substrate 212, and color conversion elements 230a and 230b (hereinafter referred to collectively as color conversion elements 230) formed on the electroluminescent element 220. Electroluminescent element 220 includes a first electrode 222, a second electrode 226, and one or more device layers 224 positioned between the first electrode 222 and the second electrode 226. All of the design considerations and possibilities described herein with respect to the substrate 12, the electroluminescent element 20, and the color conversion elements 30 of the embodiment illustrated in FIG. 1 apply equally to the substrate 212, the electroluminescent element 220, and the color conversion elements 230 of the embodiment illustrated in FIG. 3.

Electroluminescent device 200 further includes an optional black matrix 260 formed on the electroluminescent element 220. Black matrix 260 includes a plurality of apertures 262a, 262b, and 262c (hereinafter referred to collectively as apertures 262). Although the embodiment illustrated in FIG. 3 includes three apertures 262a, 262b, and 262c, the black matrix 260 can include any suitable number of apertures 262. Each aperture 262 may take any suitable shape, e.g., oval, rectangular, polygonal, etc.

In general, black matrix coatings are used in many display applications to absorb ambient light, improve contrast, and protect TFTs. The black matrix 260 (typically including absorbing or non-reflecting metals, metal oxides, metal sulfides, dyes or pigments) is formed around individual pixels, color conversion elements, or color filters of the display. In many displays, the black matrix 260 is a 0.1 to 0.2 μm coating of black chromium oxide on a display substrate. Resin black matrix (a pigment in a resin matrix) is an alternative to black chromium oxide. The resin black matrix can be coated onto the display substrate or electroluminescent device and then patterned using photolithography. To achieve a high optical density in a thin resin black matrix coating, it is typically necessary to use relatively high pigment loadings, which can be difficult to pattern using photolithography. Alternatively, the black matrix 260 can be transferred from a donor sheet to the device using a thermal transfer method, such as described in U.S. Pat. No. 6,461,775 (Pokorny et al.).

In some embodiments, the color conversion elements 230 may be transferred to the electroluminescent element 220 such that each color conversion element 230 is transferred to an aperture 262 of optional black matrix 260 using any suitable technique as described herein. For example, color conversion element 230a can be transferred to aperture 262a of black matrix 260.

Electroluminescent device 200 further includes color filters 250a, 250b, and 250c (hereinafter referred to collectively as color filters 250). Color filters 250 may be formed on one or more color conversion elements 230. For example, color filter 250a is formed on color conversion element 230a such that color filter 250a is in optical association with color conversion element 230a. Although one or more color filters 250 are shown as being formed on one or more color conversion elements 230, one or more layers or devices may be included between such color filters 250 and the color conversion elements 230. At least a portion of light emitted by color conversion element 230a is incident on color filter 250a such that the light is filtered through color filter 230a. Similarly, color filter 250b is formed on color conversion element 230b. In some embodiments, providing color filters in conjunction with color conversion elements may provide emitted light that is more saturated.

Further, one or more color filters 250 may be formed on electroluminescent device 220. For example, color filter 250c is formed on second electrode 226 of electroluminescent element 220 in aperture 262c of optional black matrix 260 such that it is in optical association with the electroluminescent element 220. In some embodiments, a color filter element that is capable of providing filtered blue light may be formed on an electroluminescent element that emits blue light such that the blue light emitted by the electroluminescent device is more saturated. Further, the use of both color conversion elements and color filters may reduce or eliminate fluorescence from ambient blue light and, therefore, increase display contrast.

Any suitable material or materials may be used to form color filters 250, e.g., those described in U.S. Pat. No. 5,521,035 (Wolk et al.). In some embodiments, if electroluminescent element 220 is formed such that it is capable of emitting UV light, it may be preferred that color filters 250 include one or more UV absorbers to aid in preventing UV light from being emitted by the electroluminescent device 200. Further, color filters 250 may be formed used any suitable technique, e.g., coating (e.g., spin coating), printing (e.g., screen printing or ink jet printing), physical or chemical vapor deposition, photolithography, and thermal transfer methods (e.g., methods described in U.S. Pat. No. 6,114,088 (Wolk et al.))). It may be preferred that color filters 250 are formed using LITI techniques as further described herein.

In some embodiments, one or more of the substrate 212, the one or more device layers 224, the color conversion elements 230, and the color filters 250 may be configured to provide polarized light as is further described, e.g., in U.S. Pat. No. 6,485,884 (Wolk et al.) and U.S. Pat. No. 5,693,446 (Staral et al.).

Figure 4:
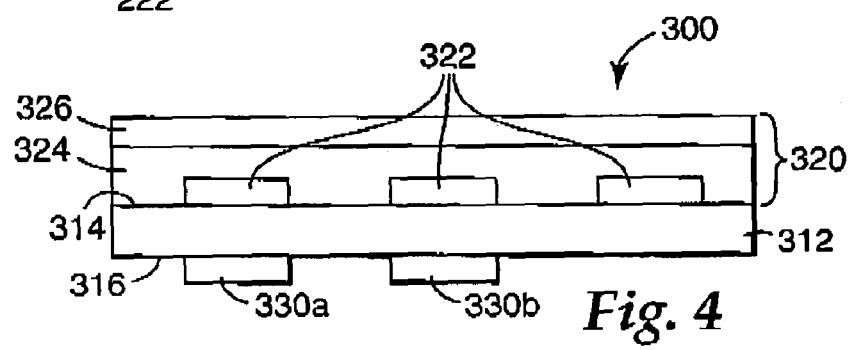
FIG. 4 is a schematic diagram of an embodiment of a bottom emitting electroluminescent device that includes color conversion elements formed on a substrate.

As described herein, electroluminescent devices may be either top emitting (e.g., electroluminescent device 10 of FIG. 1) or bottom emitting. One such embodiment of a bottom emitting device is illustrated in FIG. 4, which is a schematic diagram of another embodiment of an electroluminescent device 300. Electroluminescent device 300 is similar in many respects to electroluminescent device 10 of FIG. 1. Electroluminescent device 300 includes a substrate 312 and an electroluminescent element 320 formed on a first major surface 314 of the substrate 312. The electroluminescent element 320 includes a first electrode 322, a second electrode 326, and one or more device layers 324 positioned between the first electrode 322 and the second electrode 326.

One difference between electroluminescent device 300 and electroluminescent device 10 of FIG. 1 is that device 300 is a bottom emitting electroluminescent device. In this embodiment, the color conversion elements 330a and 330b (hereinafter referred to collectively as color conversion elements 330) are formed on a second major surface 316 of the substrate 312 such that the color conversion elements 330 are in optical association with the electroluminescent element 320. In other words, at least a portion of light emitted by electroluminescent element 320 passes through substrate 312 and is incident on at least one color conversion element 330. Although only two color conversion elements 330 are illustrated, electroluminescent device 300 may include any suitable number of color conversion elements, e.g., red and green; red, green, blue, etc. Further, electroluminescent device 300 may include at least one color filter in optical association with one or more color conversion elements or with the electroluminescent element as is described herein in reference, e.g., to electroluminescent device 200 of FIG. 3. Further, electroluminescent device 300 may include a black matrix formed on the second major surface 316 of substrate 312 as is further described herein.

All of the design considerations and possibilities described herein with respect to the substrate 12, the electroluminescent element 20, and the color conversion elements 30 of FIG. 1 apply equally to similar elements of the embodiment illustrated in FIG. 4.

All documents and publications cited herein are expressly incorporated herein by reference in their entirety into this disclosure. Illustrative embodiments of this invention are discussed and reference has been made to possible variations within the scope of this invention. These and other variations and modifications in the invention will be apparent to those skilled in the art without departing from the scope of the invention, and it should be understood that this invention is not limited to the illustrative embodiments set forth herein. Accordingly, the invention is to be limited only by the claims provided below.

What is claimed is:

1. A method of making an electroluminescent device, the method comprising:
forming an electroluminescent element on a substrate, wherein the electroluminescent element is capable of emitting light in a narrow band; and
selectively thermally transferring a plurality of color conversion elements directly to the electroluminescent element to form a pattern.

2. The method of claim 1, wherein selectively thermally transferring the plurality of color conversion elements comprises:
providing a donor sheet comprising a base layer, a light to heat conversion layer, and a transfer layer;
positioning the donor sheet such that the transfer layer is proximate the electroluminescent element; and
selectively irradiating portions of the donor sheet to thermally transfer portions of the transfer layer from the donor sheet directly to the electroluminescent element to form a pattern.

3. The method of claim 2, wherein the transfer layer comprises at least one color conversion material.

4. The method of claim 3, wherein the at least one color conversion material comprises a phosphor.

5. The method of claim 1, further comprising forming a black matrix on the electroluminescent element.

6. The method of claim 5, wherein forming the black matrix comprises selectively thermally transferring the black matrix to the electroluminescent element.

7. The method of claim 5, wherein the black matrix comprises a plurality of apertures.

8. The method of claim 7, wherein selectively thermally transferring a plurality of color conversion elements comprises selectively thermally transferring a plurality of color conversion elements directly to the electroluminescent element such that each color conversion element of the plurality of color conversion elements is transferred to an aperture of the plurality of apertures of the black matrix.

9. The method of claim 1, wherein the substrate comprises a plurality of independently addressable active devices.

10. The method of claim 1, wherein the electroluminescent element comprises an organic emissive material.

11. The method of claim 10, wherein the organic emissive material comprises a light emitting polymer.

12. The method of claim 1, wherein the electroluminescent element is capable of emitting blue light.

13. The method of claim 1, further comprising selectively thermally transferring at least one color filter to at least one color conversion element of the plurality of color conversion elements.

14. The method of claim 13, wherein the at least one color filter comprises a pigment or dye.

15. The method of claim 1, wherein at least one color conversion element of the plurality of color conversion elements comprises a phosphor.

16. The method of claim 1, wherein at least one color conversion element of the plurality of color conversion elements is capable of converting light emitted from the electroluminescent element into red light, and further wherein at least one color conversion element of the plurality of color conversion elements is capable of converting light emitted from the electroluminescent element into green light.

17. A method of making an electroluminescent device, the method comprising:
forming an electroluminescent element on a first major surface of a substrate, wherein the electroluminescent element is capable of emitting light in a narrow band; and
selectively thermally transferring a plurality of color conversion elements directly to a second major surface of the substrate to form a pattern.

18. The method of claim 17, wherein selectively thermally transferring a plurality of color conversion elements comprises:
providing a donor sheet comprising a base layer, a light to heat conversion layer, and a transfer layer;
positioning the donor sheet such that the transfer layer is proximate the second major surface of the substrate; and
selectively irradiating portions of the donor sheet to thermally transfer portions of the transfer layer from the donor sheet directly to the second major surface of the substrate to form a pattern.

19. The method of claim 17, further comprising forming a black matrix on the second major surface of the substrate.

20. The method of claim 19, wherein the black matrix comprises a plurality of apertures.

21. The method of claim 20, wherein selectively thermally transferring a plurality of color conversion elements comprises selectively thermally transferring a plurality of color conversion elements directly to the second major surface of the substrate such that each color conversion element of the plurality of color conversion elements is transferred to an aperture of the plurality of apertures of the black matrix.

22. The method of claim 17, wherein the substrate comprises a plurality of independently addressable active devices.

23. The method of claim 17, wherein the electroluminescent element comprises an organic emissive material.

24. The method of claim 23, wherein the organic emissive material comprises a light emitting polymer.

25. The method of claim 17, wherein the electroluminescent element is capable of emitting blue light.

26. The method of claim 17, further comprising selectively thermally transferring at least one color filter to at least one color conversion element of the plurality of color conversion elements.

27. The method of claim 26, wherein the at least one color filter comprises a pigment or dye.

28. The method of claim 17, wherein at least one color conversion element of the plurality of color conversion elements comprises a phosphor.

29. The method of claim 17, wherein at least one color conversion element of the plurality of color conversion elements is capable of converting light emitted from the electroluminescent element into red light, and further wherein at least one color conversion element of the plurality of color conversion elements is capable of converting light emitted from the electroluminescent element into green light.

30. A method of making an electroluminescent device, the method comprising:
forming an electroluminescent element on a substrate, wherein the electroluminescent element is capable of emitting light in a narrow band;
forming a protective layer over at least a portion of the electroluminescent element; and
selectively thermally transferring a plurality of color conversion elements directly to the protective layer to form a pattern.

31. The method of claim 30, wherein the protective layer comprises a dielectric material.

32. A method of making an electroluminescent color display comprising at least one electroluminescent device, the method comprising:

forming the at least one electroluminescent device on a substrate, wherein forming the at least one electroluminescent device comprises:

forming an electroluminescent element on the substrate, wherein the electroluminescent element is capable of emitting light in a narrow band; and selectively thermally transferring a plurality of color conversion elements directly to the electroluminescent element to form a pattern.

33. A method of making an electroluminescent device, the method comprising:

forming an electroluminescent element on a substrate, wherein the electroluminescent element is capable of emitting UV light; and selectively thermally transferring a plurality of color conversion elements directly to the electroluminescent element to form a pattern.

\* \* \* \* \*

UNITED STATES PATENT AND TRADEMARK OFFICE
CERTIFICATE OF CORRECTION

PATENT NO. : 7,892,382 B2  
APPLICATION NO. : 10/989524  
DATED : February 22, 2011  
INVENTOR(S) : Erika Bellmann et al.

Page 1 of 1

It is certified that error appears in the above-identified patent and that said Letters Patent is hereby corrected as shown below:

On the Title Page

(56) References Cited FOREIGN PATENT DOCUMENTS, page 2, Column 2, line 22

Delete "JP20002260845A"  
Insert -- JP2002260845A --

(56) References Cited OTHER PUBLICATIONS page 2, Column 2, line 38

Delete "Elkectroluminescent"  
Insert -- Electroluminescent --

Signed and Sealed this  
Twenty-ninth Day of May, 2012

David J. Kappos  
*Director of the United States Patent and Trademark Office*